US007633088B2

(12) United States Patent
Kunjal et al.

(10) Patent No.: US 7,633,088 B2
(45) Date of Patent: Dec. 15, 2009

(54) DISPLAY DEVICE, DEVICE FOR DRIVING THE DISPLAY DEVICE AND METHOD OF DRIVING THE DISPLAY DEVICE

(75) Inventors: Parikh Kunjal, Gyeonggi-do (KR); Byung-Sik Koh, Gyeonggi-do (KR); Beohm-Rock Choi, Seoul (KR); Joon-Hoo Choi, Seoul (KR); Joon-Chul Goh, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 101 days.

(21) Appl. No.: 11/553,798

(22) Filed: Oct. 27, 2006

(65) Prior Publication Data

US 2007/0096099 A1 May 3, 2007

(30) Foreign Application Priority Data

Oct. 28, 2005 (KR) ..................... 10-2005-0102553

(51) Int. Cl.
*H01L 27/14* (2006.01)

(52) U.S. Cl. .......................................... 257/59; 257/72

(58) Field of Classification Search .................... 257/59
See application file for complete search history.

(56) References Cited

U.S. PATENT DOCUMENTS 4,675,667 A * 6/1987 Nakamura et al. ............ 345/92
6,310,592 B1 * 10/2001 Moon et al. .................... 345/87
6,841,803 B2 * 1/2005 Aizawa et al. ................ 257/98
2003/0103022 A1 * 6/2003 Noguchi et al. ............... 345/77

FOREIGN PATENT DOCUMENTS

| | | |
|---|---|---|
| JP | 2002-156923 | 5/2002 |
| JP | 2003-167551 | 6/2003 |
| JP | 2003-280576 | 10/2003 |
| JP | 2004-170815 | 6/2004 |
| JP | 2004-279633 | 10/2004 |
| JP | 2005-157266 | 6/2005 |
| KR | 1020020014164 | 2/2002 |
| KR | 1020030000047 | 1/2003 |
| KR | 1020030037393 | 5/2003 |
| KR | 1020040083785 | 10/2004 |
| KR | 1020040087427 | 10/2004 |
| KR | 1020050004936 | 1/2005 |
| KR | 100486908 | 4/2005 |

* cited by examiner

*Primary Examiner*—Wai-Sing Louie
*Assistant Examiner*—Bilkis Jahan
(74) *Attorney, Agent, or Firm*—H.C. Park & Associates, PLC

(57) ABSTRACT

A display device including a plurality of pixels is disclosed. Each of the pixels includes a switching transistor, a plurality of scanning lines connected to the switching transistors and a plurality of data lines connected to the switching transistors. The scanning lines transmit a gate turn-on voltage that turns on the switching transistors and a gate turn-off voltage that turns off the switching transistors and the data lines transmit a data voltage. The gate turn-on voltage is determined based on a maximum value of the data voltage. The gate turn-on voltage based on the maximum value of the data voltage results in high luminance and less crosstalk phenomenon.

11 Claims, 8 Drawing Sheets

DISPLAY DEVICE, DEVICE FOR DRIVING THE DISPLAY DEVICE AND METHOD OF DRIVING THE DISPLAY DEVICE

CROSS-REFERENCE OF RELATED APPLICATIONS

The present application claims priority from Korean Patent Application No. 2005-0102553, filed on Oct. 28, 2005, the disclosure of which is hereby incorporated herein by reference in its entirety.

BACKGROUND OF THE INVENTION

1. Field of the Invention

The present invention relates to a display device, a device for driving the display device, and a method of driving the display device.

2. Description of the Related Art

Recent trends of personal computers and television sets require lighter and thinner display devices. Flat panel displays satisfying the requirements have been substituted for conventional cathode ray tube displays.

The flat panel displays include a liquid crystal display, a field emission display, an organic light emitting device, a plasma display panel, etc.

One type of flat panel display is an active matrix flat panel display. An active matrix organic light emitting device includes a plurality of pixels arranged in a matrix configuration and displays images by controlling the luminance of the pixels based on luminance information indicative of a desired image. The organic light emitting device is a self-emissive display device that has low power consumption, a wide viewing angle, and a fast response time.

The organic light emitting device includes an organic light emitting element and at least one thin film transistor connected to the organic light emitting element. The thin film transistor includes various conditions of silicon such as polycrystalline silicon, amorphous silicon, etc as a semiconductor layer. Use of the thin film transistor generates a kick back effect and a leakage current which causes crosstalk phenomenon.

SUMMARY OF THE INVENTION

In accordance with an embodiment of the present invention, a display device has a plurality of pixels, and each of the pixels includes a switching transistor, a plurality of scanning lines connected to the switching transistors of the pixels and a plurality of data lines connected to the switching transistors. The scanning lines transmit a gate turn-on voltage that turns on the switching transistors and a gate turn-off voltage that turns off the switching transistors. The data lines transmit a data voltage. The gate turn-on voltage is substantially identical to a maximum value of the data voltage. The gate turn-on voltage is determined based on the maximum value of the data voltage.

The gate turn-on voltage is determined so that at least one of the pixels has a substantial maximum luminance at the maximum value of the data voltage.

The gate turn-on voltage follows the following formula:

$$Vdm-\alpha \leqq Von \leqq Vdm+\beta$$

wherein Von is the gate turn-on voltage, Vdm is the maximum value of the data voltage, and $\alpha$ and $\beta$ are respectively positive numbers. $\alpha$ is about 3 and $\beta$ is about 3. Alternatively, $\alpha$ is about 3 and $\beta$ is about 6. The maximum value of the data voltage is in a range of about 10 V to about 15 V.

In accordance with another embodiment of the present invention, a device for driving a display device has, a plurality of pixels, and each of the pixels includes a switching transistor, a plurality of scanning lines connected to the switching transistors of the pixels and a plurality of data lines connected to the switching transistors. The scanning lines transmit a gate turn-on voltage that turns on the switching transistors and a gate turn-off voltage that turns off the switching transistors. The data lines transmit a data voltage. The device for driving the display device includes a driving voltage generator that generates the gate turn-on voltage and the gate turn-off voltage, a scan driver that transmits the gate turn-on voltage to the scanning lines, and a data driver that transmits the data voltage to the data lines. The gate turn-on voltage is substantially identical to a maximum value of the data voltage. The gate turn-on voltage is determined based on the maximum value of the data voltage.

In accordance with another embodiment of the present invention, a display device is driven. The display device has a plurality of switching transistors, a plurality of pixels having the switching transistors, a plurality of scanning lines connected to the switching transistors, and a plurality of data lines connected to the switching transistors. The scanning lines transmit a gate turn-on voltage that turns on the switching transistors and a gate turn-off voltage that turns off the switching transistors. The data lines transmit a data voltage. In the method, the gate turn-on voltage and the gate turn-off voltage are generated. The gate turn-on voltage is substantially identical to a maximum value of the data voltage. The gate turn-on voltage is transmitted to the scanning lines, and the data voltage is transmitted to the data lines.

BRIEF DESCRIPTION OF THE DRAWINGS

The above and other advantages of the present invention will become more apparent by describing in detail exemplary embodiments thereof with reference to the accompanying drawings, in which.

DESCRIPTION OF THE EMBODIMENTS

Figure 1:
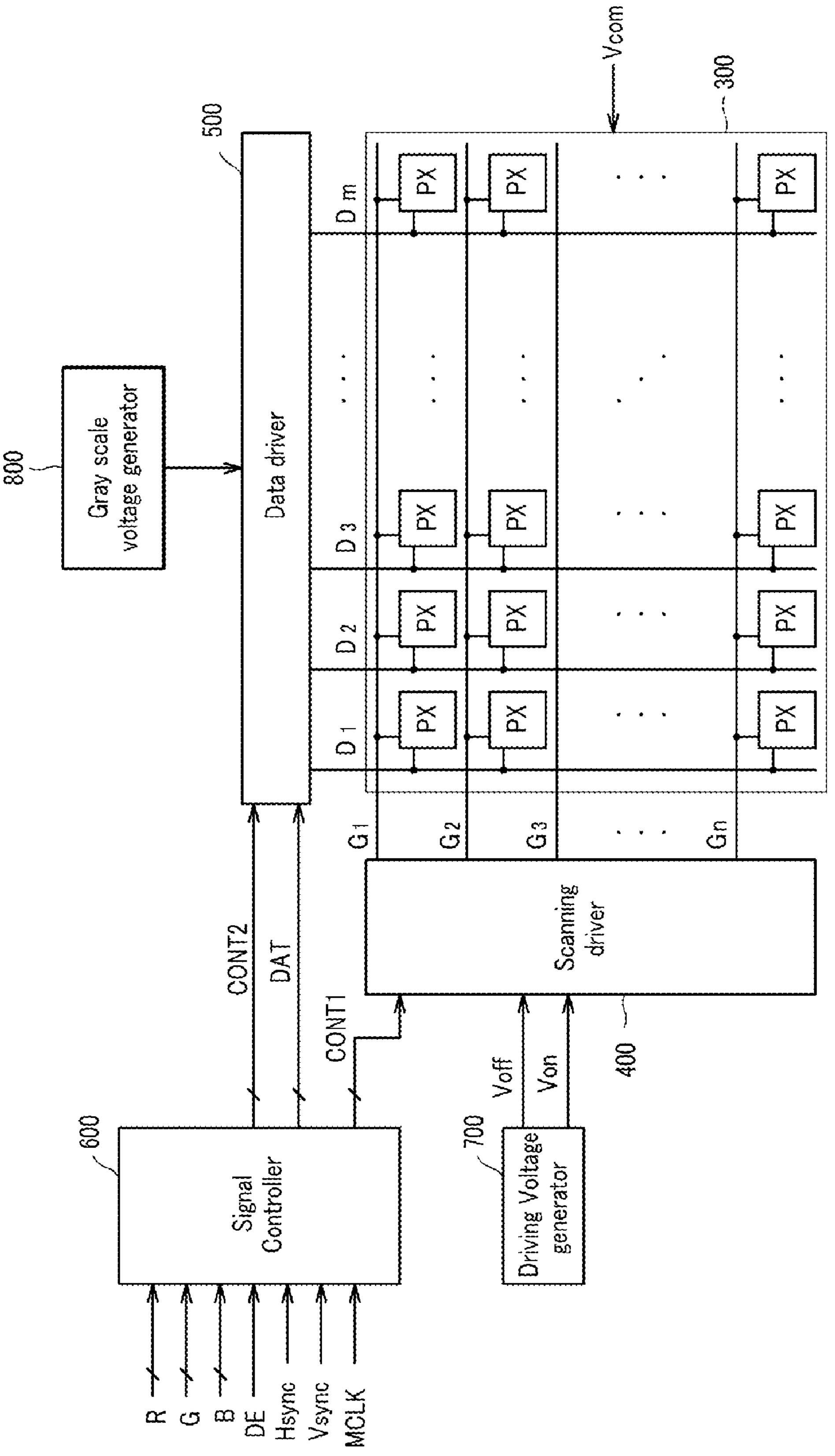
FIG. 1 is a block diagram of an organic light emitting device according to an embodiment of the invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an organic light emitting device according to one embodiment of the invention will be described in detail with reference to FIGS. 1 and 2.

FIG. 1 is a block diagram of the organic light emitting device according to an embodiment of the invention. FIG. 2 is an equivalent circuit diagram of the organic light emitting device according to an embodiment of the invention.

As shown in FIG. 1, the organic light emitting device has a display panel 300, a scan driver 400 connected to the display panel 300, a data driver 500 connected to the display panel 300, a driving voltage generator 700 connected to the scan driver 400, a gray scale voltage generator 800 connected to the data driver 500, and a signal controller 600.

The display panel 300 has a plurality of signal lines $G_1$-$G_n$, $D_1$-$D_m$ and a plurality of pixels PX. The plurality of pixels PX arranged in a matrix configuration are connected to the signal lines $G_1$-$G_n$, $D_1$-$D_m$.

The scan signal lines $G_1$-$G_n$ are substantially parallel to one another in a horizontal direction. The data signal lines $D_1$-$D_m$ are substantially parallel to one another in a vertical direction.

Figure 2:
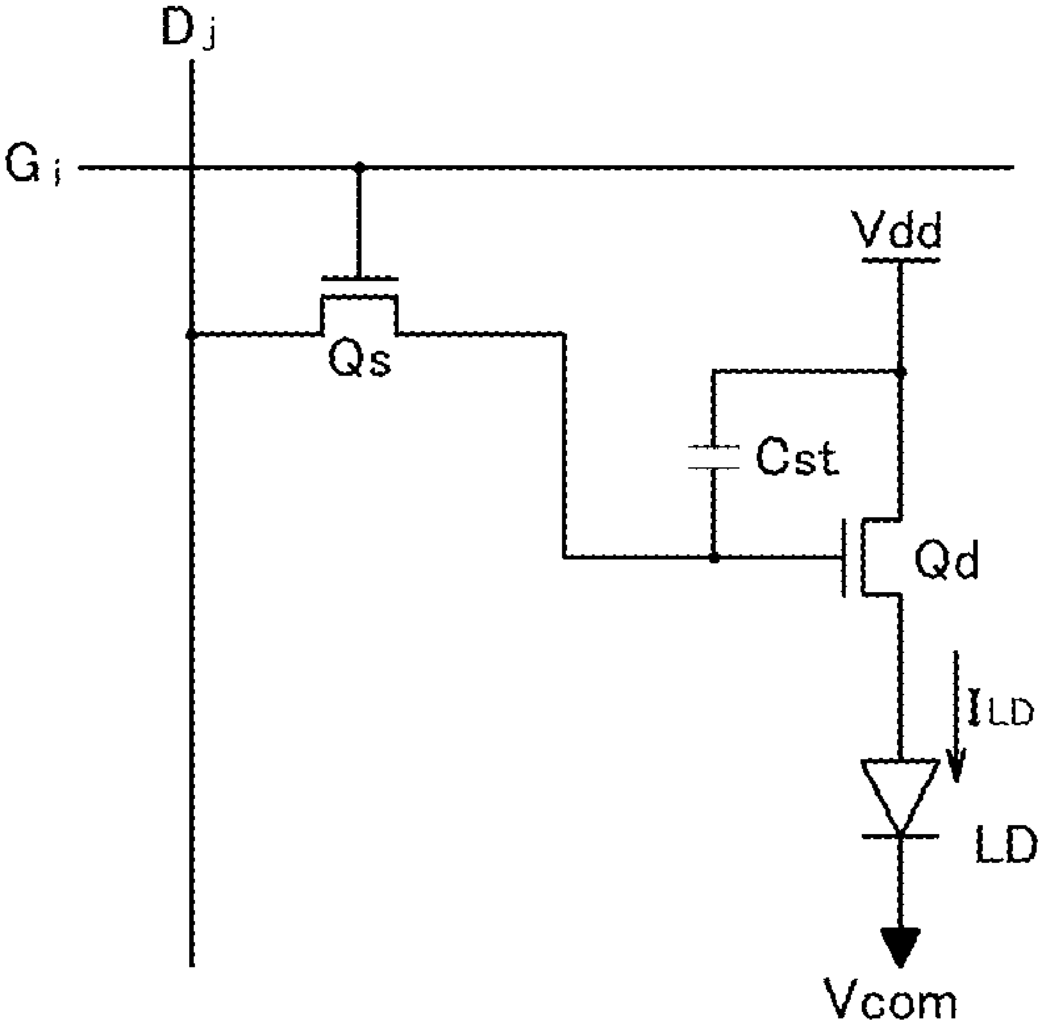
FIG. 2 is an equivalent circuit diagram of an organic light emitting device according to an embodiment of the invention.

Referring to FIG. 2, a pixel connected to a scan signal line $G_i$ and a data line $D_j$ has an organic light emitting element LD, a driving transistor Qd, a capacitor Cst, and a switching transistor Qs.

The driving transistor Qd has a control terminal connected to the switching transistor Qs and the capacitor Cst, an input terminal connected to a power supply voltage Vdd, and an output terminal connected to the organic light emitting element LD.

The switching transistor Qs has a control terminal connected to the scan signal line $G_i$, an input terminal connected to the data line $D_j$, and an output terminal connected to the capacitor Cst and the driving transistor Qd.

The capacitor Cst is connected between the switching transistor Qs and the power supply voltage Vdd. The capacitor Cst holds a data voltage provided through the data line $D_j$ and the switching transistor Qs for a certain period.

The organic light emitting element LD has an anode connected to the driving transistor Qd and a cathode connected to a common voltage Vcom. The organic light emitting element LD emits light according to the intensity of output current $I_{LD}$ supplied from the driving transistor Qd. The intensity of the output current $I_{LD}$ depends on the voltage between control terminal of the driving transistor Qd and the output terminal of the driving transistor Qd.

In some embodiments, the switching transistor Qs and the driving transistor Qd are respectively n type electric field effect transistors (FET) having amorphous silicon or polycrystalline silicon. In some embodiments, the switching transistor Qs and the driving transistor Qd are respectively p type electric field effect transistors. The operations, voltages and currents of the p type transistors are opposite to those of the n type transistors.

The driving transistor Qd and the organic light emitting element LD of FIG. 2 will be described in detail with reference to FIGS. 3 and 4.

Figure 3:
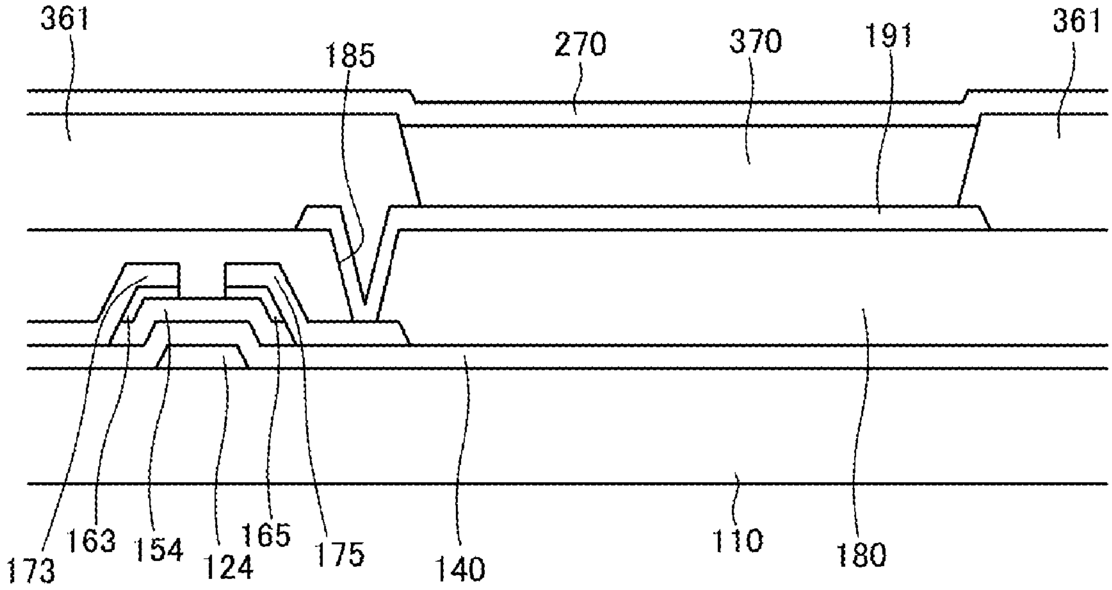
FIG. 3 is a cross-sectional view of an organic light emitting device according to an embodiment of the invention.
Figure 4:
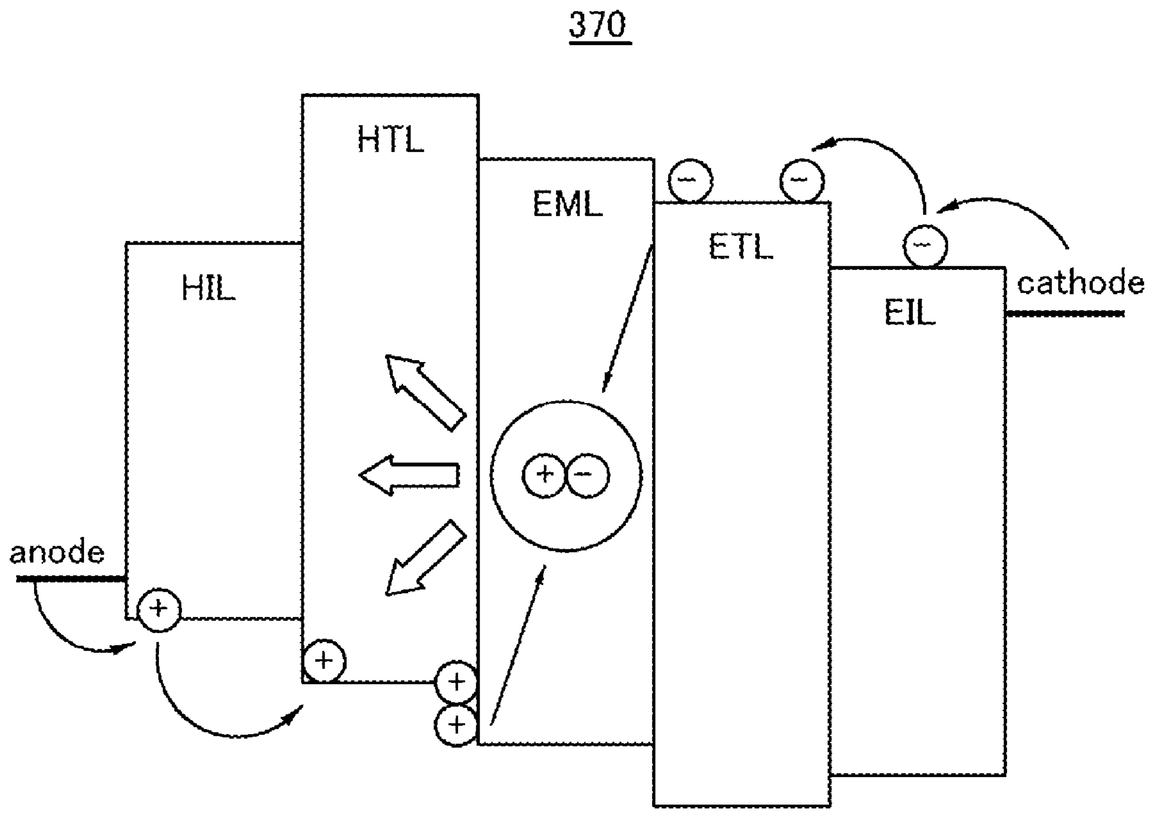
FIG. 4 is a schematic cross-sectional view of an organic light emitting device according to an embodiment of the invention.

FIG. 3 is a cross-sectional view of the organic light emitting device according to an embodiment of the invention. FIG. 4 is a schematic cross-sectional view of the organic light emitting device according to an embodiment of the invention.

A control electrode 124 is formed on an insulating substrate 110. The control electrode 124 may include aluminum based metal such as aluminum or aluminum alloy, silver based metal such as silver or silver alloy, copper based metal such as copper or copper alloy, molybdenum based metal such as molybdenum or molybdenum alloy, chromium, titanium, tantalum, or alloys thereof. In some embodiments, the control electrode 124 may have at least two layers. One layer may include a low resistivity metal such as aluminum based metal, silver based metal or copper based metal that reduces signal delays or voltage drops. Another layer may include indium tin oxide (ITO) or indium zinc oxide (IZO) that has good contact properties in physical, chemical or electrical aspects. In some embodiments, the control electrode 124 includes a lower layer of chromium or chromium alloy and an upper layer of aluminum or aluminum alloy. In some embodiments, the control electrode 124 includes a lower layer of aluminum or aluminum alloy and an upper layer of molybdenum or molybdenum alloy. In some embodiments, the control electrode 124 includes a lower layer of molybdenum or molybdenum alloy, a middle layer of aluminum or aluminum alloy and an upper layer of aluminum or aluminum alloy. The material of the control electrode 124 is not limited to above and the control electrode 124 may include various other metals or conductive materials.

The control electrode 124 is inclined relative to the surface of the insulating substrate 110 and the inclination angle is in a range of about 30 to about 80 degrees.

An insulating layer 140 is formed on the control electrode 124. The insulating layer 140 includes inorganic material such as silicon nitride or silicon oxide. The insulating layer 140 may also include organic material.

A semiconductor 154 is formed on the insulating layer 140. The semiconductor 154 includes hydrogenated amorphous silicon or polycrystalline silicon.

A pair of ohmic contacts 163 and 165 is formed on the semiconductor 154. The ohmic contacts 163 and 165 may include silicide or n+ hydrogenated a-Si heavily doped with n type impurity such as phosphorous.

The lateral sides of the semiconductor 154 and the ohmic contacts 163 and 165 are inclined relative to the surface of the insulating substrate 110, and the inclination angle is in a range of about 30 to about 80 degrees.

An input electrode 173 and an output electrode 175 are formed on the ohmic contacts 163 and 165 and the insulating layer 140. The input electrode 173 and the output electrode 175 may include refractory metal such as chromium, molybdenum, tantalum, or alloys thereof. The input electrode 173 and the output electrode 175 may also have at least two layers including a refractory metal film and a low resistivity film. In some embodiments, the input electrode 173 and the output electrode 175 include a lower Cr/Mo (alloy) film and an upper Al (alloy) film, a lower Mo (alloy) film, a middle Al (alloy) film and an upper Mo (alloy) film. The input electrode 173 and the output electrode 175 are inclined relative to the surface of the insulating substrate 110 and the inclination angle is in a range of about 30 to about 80 degrees.

The input electrode 173 and the output electrode 175 are separated from each other and disposed opposite with respect to the control electrode 124. The control electrode 124, the input electrode 173, the output electrode 175 and the semiconductor 154 form a thin film transistor.

The ohmic contacts 163 and 165 are interposed only between the semiconductor stripes and the overlying electrodes 173 and 175. The ohmic contacts 163 and 165 reduce the contact resistance between the semiconductor 154 and the input electrode 173 and the contact resistance between the semiconductor 154 and the output electrode 175. The semiconductor 154 includes an exposed portion, which is not covered with the input electrode 173 and the output electrode 175.

A passivation layer 180 is formed on the input electrode 173, the output electrode 175, the exposed portion of the semiconductor 154, and the insulating layer 140. In some embodiments, the passivation layer 180 includes an inorganic material such as silicon nitride or silicon oxide, an organic material, or a low dielectric constant insulating material. The low dielectric constant material has dielectric constant lower than 4.0. Examples of the low dielectric constant material include a-Si:C:O or a-Si:O:F formed by plasma enhanced chemical vapor deposition (PECVD). In some embodiments, the passivation layer 180 may include photosensitive material.

The passivation layer 180 has a contact hole 185 exposing a portion of the output electrode 175.

A pixel electrode 191 is formed on the passivation layer 180. The pixel electrode 191 is physically and electrically connected to the output electrode 175 through the contact hole 185. The pixel electrode 191 may include a transparent conductive material such as indium tin oxide or indium zinc oxide. The pixel electrode 191 may further include a reflective metal layer such as Cr, Ag, Al or alloys thereof.

A partition 361 is formed on the passivation layer 180. The partition 361 encloses the periphery of the pixel electrode 191 to define an opening. The partition 361 includes organic insulating material and/or inorganic insulating material.

An organic light emitting member 370 is formed on the pixel electrode 191. The organic light emitting member 370 has at least two layers including an emitting layer EML and an auxiliary layer that improves the emission efficiency. Examples of the auxiliary layer include an electron transport layer (ETL), a hole transport layer (HTL), an electron injecting layer (EIL), a hole injecting layer (HIL), a hole blocking layer (HBL) or combinations thereof.

A common electrode 270 to be supplied with the common voltage Vcom is formed on the organic light emitting member 370 and the partition 361. When the pixel electrode 191 is transparent, the common electrode 270 may include metal including Ca, Ba, and/or Al. The common electrode 270 can include transparent conductive material such as ITO and/or IZO.

A combination of an opaque pixel electrode 191 and a transparent common electrode 270 is employed in a top emission organic light emitting device that emits light toward the top of the display panel 300. A combination of a transparent pixel electrode 191 and an opaque common electrode 270 is employed in a bottom emission organic light emitting device that emits light toward the bottom of the display panel 300.

The pixel electrode 191, the organic light emitting member 370 and the common electrode 270 form an organic light emitting element LD having the pixel electrode 191 as an anode and the common electrode 270 as a cathode or vice versa. The organic light emitting element LD uniquely emits primary color lights, depending on the material of the light emitting member 370. An exemplary set of primary colors includes three primary colors: red, green, and blue. The display of images is realized by the addition of the three primary colors. In some embodiments, the organic light emitting element LD emits white light and the primary color light is displayed through a color filter.

Referring back to FIGS. 1 and 2, the driving voltage generator 700 generates a gate turn-on voltage Von that turns on the switching transistor Qs and a gate turn-off voltage Voff that turns off the switching transistor Qs. The driving voltage generator 700 may also generate the common voltage Vcom and the power supply voltage Vdd. In one embodiment, the gate turn-on voltage Von has a value substantially identical to the data voltage at a maximum gray scale (hereinafter, referred to as a maximum data voltage Vdm). The gate turn-off voltage Voff has a value low enough to maintain the switching transistor Qs in an off state.

The gray scale voltage generator 800 generates a collection of gray scale voltages that determine the luminance of the pixels PX (or a collection of standard gray scale voltages).

The scan driver 400 is connected to the scan signal lines $G_1$-$G_n$. The scan driver 400 receives the gate turn-on voltage Von and the gate turn-off voltage Voff from the driving voltage generator 700 and transmits scan signals having the gate turn-on voltage Von and the gate turn-off voltage Voff to the scan signal lines $G_1$-$G_n$.

The data driver 500 is connected to the data lines $D_1$-$D_m$. The data driver 500 selects a gray scale voltage from the gray scale voltage generator 800 and transmits the gray scale voltage to the data lines $D_1$-$D_m$ as a form of a data voltage. When the gray scale voltage generator 800 provides certain number of standard gray scale voltages instead of all gray scale voltages, the data driver 500 converts the standard gray scale voltages into all gray scale voltages and selects a proper data voltage.

The signal controller 600 controls the scan driver 400 and the data driver 500.

The scan driver 400, the data driver 500, the signal controller 600, the driving voltage generator 700 and the gray scale voltage generator 800 may be included in integrated circuit (IC) chips mounted on the display panel 300. In some embodiments, the scan driver 400, the data driver 500, the signal controller 600, the driving voltage generator 700 and the gray scale voltage generator 800 may be directly integrated on the display panel 300 along with the signal lines $G_1$-$G_n$ and $D_1$-$D_m$ and the transistors Qd and Qs.

Hereinafter, referring back to FIGS. 1 and 2, the operation of the organic light emitting device according to an embodiment of the invention will be described in detail.

The signal controller 600 receives input image signals such as red (R), green (G), blue (B) signals and input control signals from an external graphic controller (not shown). The input signal signals have information on the luminance of each pixel. The luminance has a predetermined number of gray scales such as $1024(=2^{10})$, $256(=2^8)$ or $64(=2^6)$. The input image signals also include a vertical synchronization signal Vsync and a horizontal synchronization signal Hsync, a main clock MCLK and a data enable signal DE.

The signal controller 600 processes the input image signals R, G, B according to the operation condition of the display panel 300 and the data driver 500. Then, the signal controller 600 generates scan control signals CONT1 and data control signals CONT2. The signal controller 600 sends the scan control signals CONT1 to the scan driver 400. The signal controller 600 sends the data control signals CONT2 and the processed image signals DAT to the data driver 500. The image signals DAT which are digital signals have a predetermined number of gray scales.

The scan control signals CONT1 include a scanning start signal (not shown) to initiate scanning and at least one clock signals (not shown) for controlling the output time of the gate turn-on voltage Von. The scan control signals CONT1 may include a plurality of output enable signals (not shown) for defining the duration of the gate turn-on voltage Von.

The data control signals CONT2 include a horizontal synchronization start signal (not shown) to initiate data transmission for a group of pixels PX, a load signal (not shown) instructing the data driver 500 to apply the data voltages to the data lines $D_1$-$D_m$ and a data clock signal (not shown).

In response to the data control signals CONT2, the data driver 500 receives the image signals DAT of a group of pixels from the signal controller 600. The data driver 500 selects the gray scale voltage corresponding to each image signal DAT and converts the image signal DAT into an analog data voltage. The converted analog data voltage is transmitted to corresponding data lines $D_1$-$D_m$. In some embodiments, the data driver 500 divides the standard gray scale voltage supplied from the gray scale voltage generator 800 and generates gray scale voltages. The data driver 500 transmits the generated gray scale voltages to the corresponding data lines $D_1$-$D_m$ as a form of data voltages.

The scan driver 400 provides the gate turn-on voltage Von to the scanning lines $G_1$-$G_n$ in response to the scan control signals CONT1 to turn on the switching transistors Qs. Then, the data voltages provided in the data lines $D_1$-$D_m$ are applied to the capacitors Cst and the control terminals of the driving transistors Qd through the activated switching transistors Qs. The capacitors Cst hold the data voltages and the voltages held in the capacitors Cst are maintained after the switching transistors Qs are turned off. Thus, the voltage between the control terminal the driving transistor Qd and the output terminal of the driving transistor Qd can be maintained.

The driving transistor Qd sends the output current $I_{LD}$ to the organic light emitting element LD. The organic light emitting element LD emits light having an intensity depending on the output current $I_{LD}$.

By repeating this procedure for each scanning line during successive units of a horizontal period (which is denoted by "1H" and equal to one period of the horizontal synchronization signal Hsync and the data enable signal DE), all scanning lines $G_1$-$G_n$ are sequentially supplied with the gate turn-on voltages Von during the first frame, thereby applying the data voltages to all pixels.

Hereinafter, the relationship between the gate turn-on voltage and the data voltage in the organic light emitting element according to one embodiment will be explained with reference to FIGS. 5 and 6.

Figure 5:
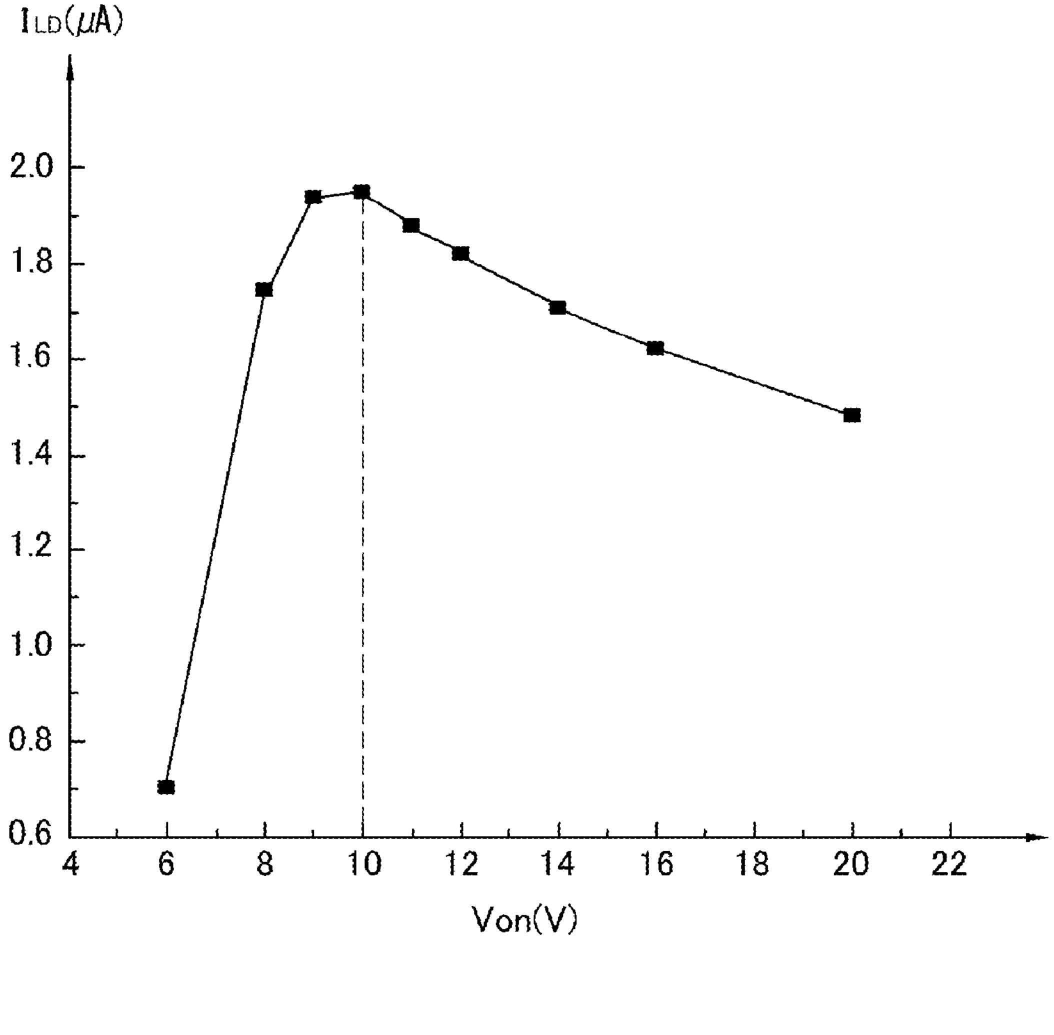
FIG. 5 is a graph illustrating the relationship between a driving current and a gate turn-on voltage of an organic light emitting device according to an embodiment of the invention.

FIG. 5 is a graph illustrating the relationship between a driving current and a gate turn-on voltage of the organic light emitting device according to an embodiment of the invention. FIG. 6 shows a graph illustrating the relationship between a data voltage and a gate turn-on voltage of the organic light emitting device according to an embodiment of the invention.

Experiment 1

The data voltage Vd is fixed to 10V and the output currents $I_{LD}$ of the driving transistor Qd are measured while changing the gate turn-on voltage Von. The power supply voltage Vdd is fixed to be 16V and the common voltage Vcom is fixed to be −0.5V. The gate turn-off voltage Voff is fixed to −7V and the duty cycle of the gate turn-on voltage Von and the gate turn-off voltage Voff is 0.2%. The results are shown in FIG. 5.

Referring to FIG. 5, the output current $I_{LD}$ has a maximum value when the gate turn-on voltage Von is 10V. When the gate turn-on voltage Von is greater or smaller than 10V, the output current $I_{LD}$ tends to decrease. It can be assumed that the data voltage Vd is not sufficiently charged through the switching transistor Qs at the gate turn-on voltage lower than 10V. At the gate turn-on voltage higher than 10V, the kickback voltage seems to affect the switching transistor Qs.

The output current $I_{LD}$ is known to be proportionate to the luminance of the organic light emitting element LD. Maximum output current $I_{LD}$ represents maximum luminance of the organic light emitting element LD. Thus, the organic light emitting device of FIG. 5 having data voltage Vd of 10V has maximum luminance when the gate turn-on voltage Von is 10V.

Experiment 2

Another set of experiments was conducted to find gate voltages having maximum current output $I_{LD}$ while changing the data voltages Vd to 4V, 6V, 8V, 10V, 12V and 13.5V. Other conditions are identical as in Experiment 1. The results are shown in FIG. 6. In FIG. 6, an X axis represents the gate turn-on voltage Von. A left Y axis represents the data voltage Vd and a left Y axis represents the output current $I_{LD}$.

Figure 6:
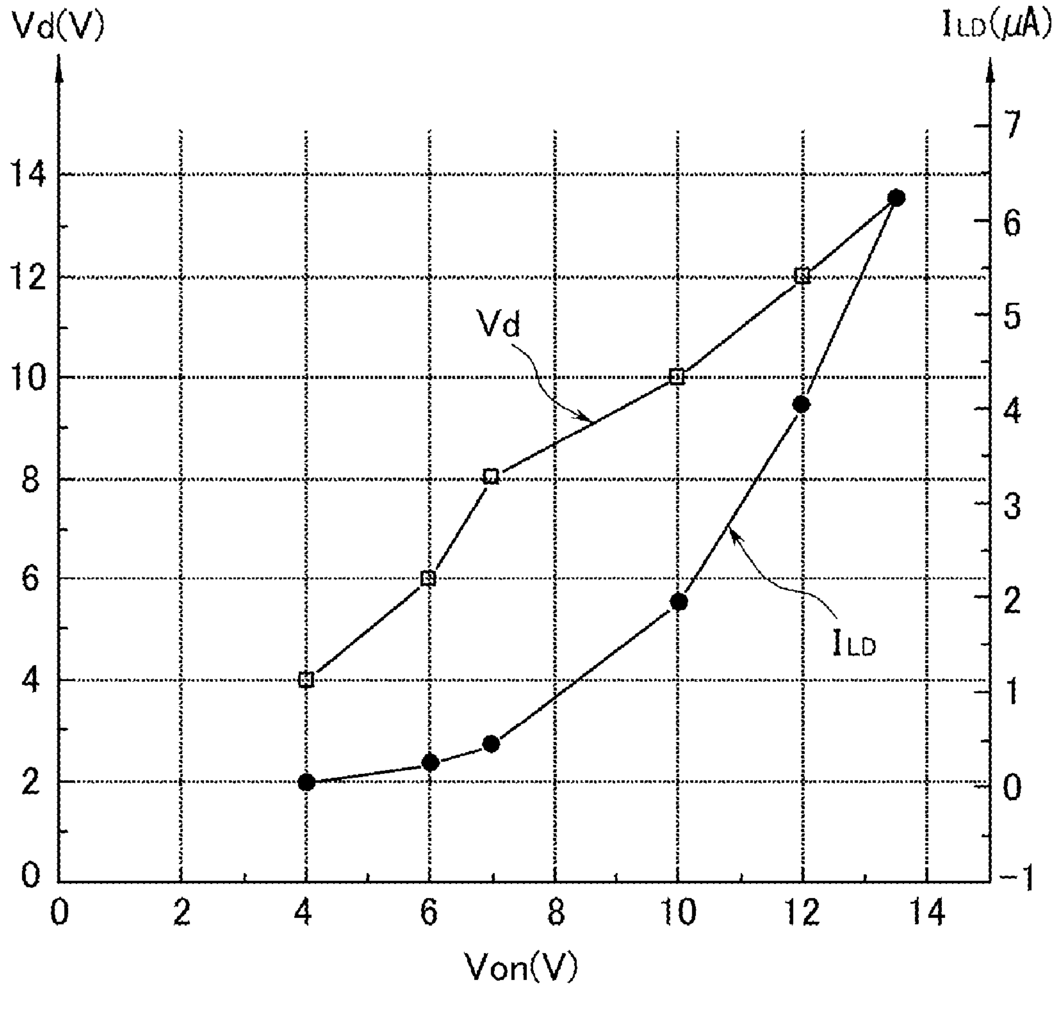
FIG. 6 shows a graph illustrating the relationship between a data voltage and a gate turn-on voltage of an organic light emitting device according to an embodiment of the invention.

Referring to FIG. 6, the output currents $I_{LD}$ have maximum values when the gate turn-on voltages are about 4V, 6V, 7V, 10V, 12V and 13.5V respectively. It is inferred that the gate turn-on voltage Von having a value substantially identical to the data voltage Vd becomes an optimum gate turn-on voltage. In the experiment, one gate turn-on voltage Von has an optimum value of 7V when the data voltage Vd is 8V, which is a little bit deviated from the above rule. Because usual maximum data voltages Vdm are in the range of 10V and 15V, it is assumed that the deviation at the data voltage Vd of 8V could be neglected. When the gate turn-on voltage Von is determined to have a value substantially identical to the maximum data voltage Vdm, the organic light emitting device employing the gate turn-on voltage Von may have maximum luminance. The luminance of gray scales smaller than the maximum gray scale can be determined based on a gamma curve.

Meanwhile, the luminance difference between an application of a gate turn-on voltage Von having a value near the maximum data voltage Vdm and an application of a gate turn-on voltage Von having a value identical to the maximum data voltage Vdm is not great. Thus, the gate turn-on voltage Von may be selected from a certain range. The gate turn-on voltage Von is smaller than or equal to the maximum data voltage Vdm by a first value α and the gate turn-on voltage Von is greater than or equal to the maximum value of the data voltage by a second value β. The range of the gate turn-on voltage is expressed by the following formula:

Formula:

$$Vdm-\alpha \leqq Von \leqq Vdm+\beta$$

wherein Von is the gate turn-on voltage, Vdm is the maximum value of the data voltage, and α and β are respectively positive numbers.

α and β are determined according to the features or the operation conditions of the display panel 300. In one embodiment, α is about 3 and β is about 3. In another embodiment, α is about 3 and β is about 6.

The gate turn-on voltage Von set according to the above formula may be applied to various organic light emitting devices having some deviations.

The relationship between the gate turn-on voltage Von and the crosstalk phenomenon of the organic light emitting device will be described in detail with reference to FIGS. 7 and 8.

Figure 7:
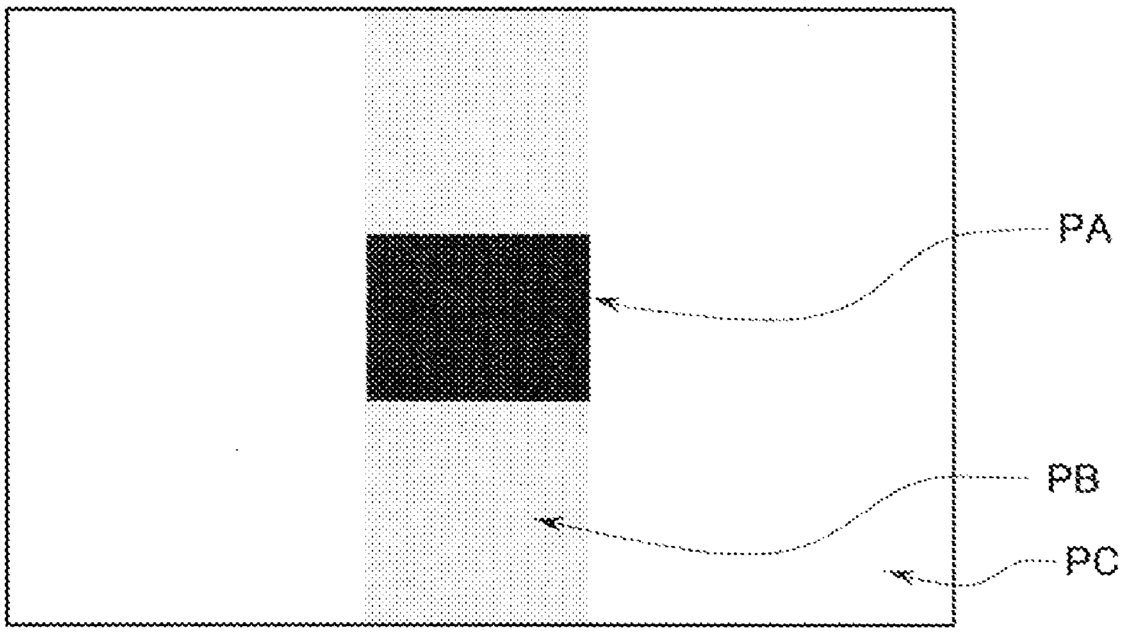
FIG. 7 is an image pattern in an organic light emitting device for testing the crosstalk phenomenon.

FIG. 7 is an image pattern in the organic light emitting device for testing the crosstalk phenomenon. FIG. 8 shows graphs illustrating luminance of the areas of FIG. 7 depending on a gate turn-on voltage.

Referring to FIG. 7, the image pattern has a central black area PA and a peripheral area.

The crosstalk phenomenon is known to be caused by leakage current when the switching transistor Qs is turned off. When different data voltages are applied to adjacent pixels connected to one data line, the current leaked through the turned off switching transistor flows through the data line and this affects the voltage of the control terminal of adjacent driving transistor Qd. This results in mixing of color brightness between adjacent pixels. In particular, when the luminance difference between adjacent pixels is large such as black and white as shown in the image pattern of FIG. 7, gray is displayed in some area PB instead of white.

Experiment 3

Experiments were conducted on a display panel to find the gate turn-on voltage that can reduce the crosstalk phenomenon while the display panel displays the image illustrated in FIG. 7. The results are shown in FIG. 8. In the experiment, the data voltage Vd for displaying white is 13V and the power supply voltage Vdd is 13V. The gate turn-off voltage is −7V and the duty cycle of the gate turn-on voltage Von and the gate turn-off voltage Voff is 0.2%.

Figure 8:
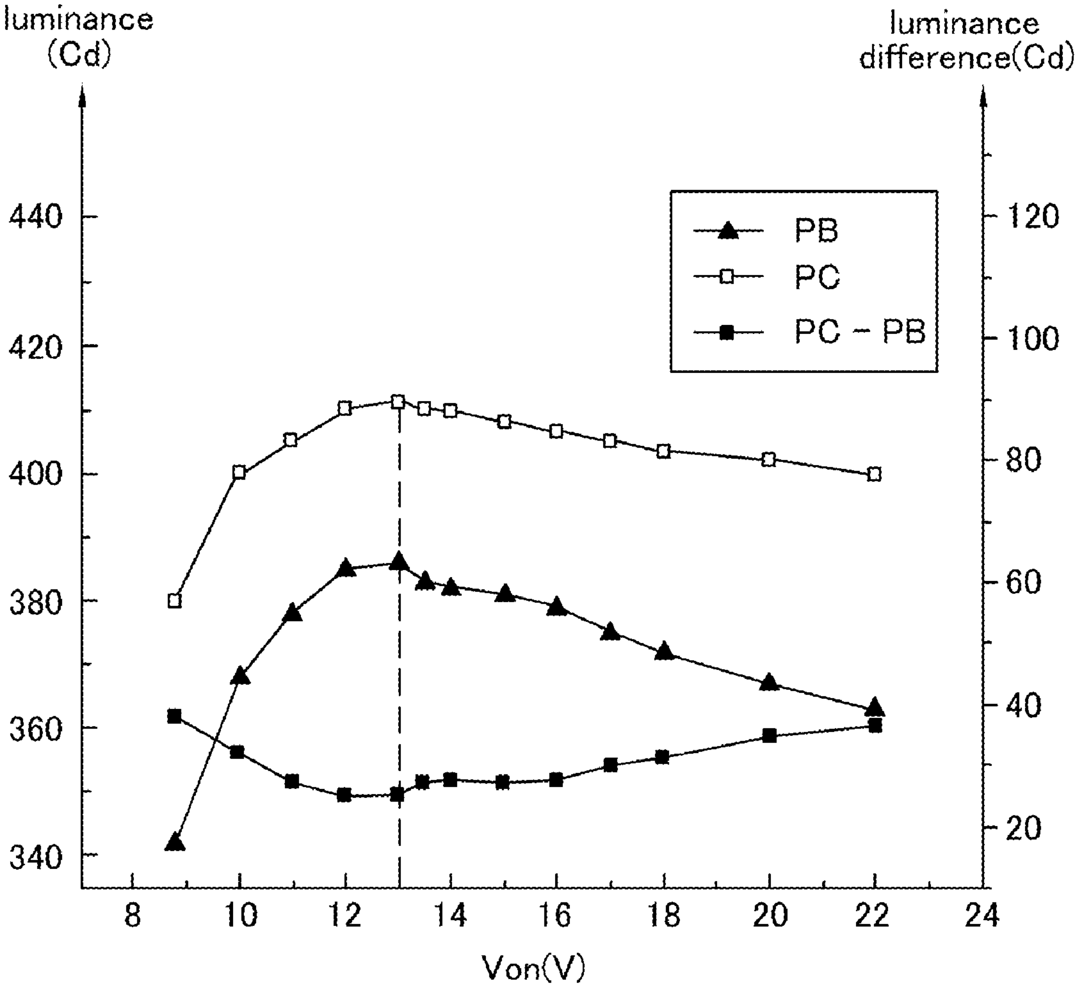
FIG. 8 shows graphs illustrating luminance of the areas of FIG. 7 depending on a gate turn-on voltage.

In FIG. 8, the left Y axis represents the luminance of a gray area PB and a white area PC in FIG. 7 and the right Y axis represents the luminance difference between the gray area PB and the white area PC.

Referring to FIG. 8, the white area PC has high luminance when the gate turn-on voltage Von is 13V which is identical to the data voltage Vd. The configuration of the luminance graph of the white area PC is similar to FIG. 5 which shows the configuration of the output current $I_{LD}$ depending on the gate turn-on voltage Von. Meanwhile, the luminance having the gate turn-on voltages Von near 13V does not vary substantially from the luminance at gate turn-on voltage of 13V.

The gray area PB has high luminance when the gate turn-on voltage Von is 13V which is identical to the data voltage Vd. The configuration of the luminance graph of the gray area PB is also similar to FIG. 5 which shows the configuration of the output current $I_{LD}$ depending on the gate turn-on voltage Von. When the gate turn-on voltage is higher or lower than 13V, the luminance tends to decrease. The luminance difference between the gray area PB and the white area PC has a minimum value when the gate turn-on voltage Von is 13V. When the gate turn-on voltage is higher or lower than 13V, the luminance difference tends to increase. Higher luminance of the gray area PB represents less crosstalk. Smaller luminance difference between the gray area PB and the white area PC represents less crosstalk. Therefore, the gate turn-on voltage Von having a value identical to the data voltage Vd results in less crosstalk and becomes the optimum gate turn-on voltage.

Even if the gate turn-on voltage Von is not equal to the maximum data voltage Vdm and the gate turn-on voltage Von is determined within the range of Formula 1, the crosstalk does not increase much.

Usually, the gate turn-on voltage Von has a value of 20V to 25V and the maximum data voltage Vdm has a value of 10V to 15V. Thus, the gate turn-on voltage Von is generally higher than the maximum data voltage. Use of the gate turn-on voltage Von near the value of the maximum data voltage Vdm according to an embodiment of the present invention may reduce power consumption.

In the experiment above, the output current $I_{LD}$ and the luminance value could be changed according to the features or operation conditions of the display panel 300. Even in this case, the characteristic of the output current $I_{LD}$ and the luminance tendency depending on the gate turn-on voltage Von do not change substantially.

As described above, the gate turn-on voltage set based on the value of the maximum data voltage results in high luminance and less crosstalk phenomenon.

This invention has been described with reference to the exemplary embodiments of an organic light emitting device. It is evident, however, that many alternative modifications and variations will be apparent to those having skill in the art in light of the foregoing description. Accordingly, the present invention embraces all such alternative modifications and variations as fall within the spirit and scope of the appended claims, and the subject matter of the present invention can be applied to other display devices such as liquid crystal display devices.

What is claimed is:

1. A display device comprising:

a plurality of pixels, each of the pixels comprising a switching transistor and a driving transistor connected to the switching transistor and a power supply voltage;

a plurality of scanning lines connected to the switching transistors of the pixels, wherein the scanning lines transmit a gate turn-on voltage that turns on the switching transistors and a gate turn-off voltage that turns off the switching transistors; and a plurality of data lines connected to the switching transistors, the data lines to transmit a data voltage, wherein the gate turn-on voltage follows the following formula:

$$Vdm-3 \leqq Von \leqq Vdm+6$$

wherein Von is the gate turn-on voltage and Vdm is the maximum value of the data voltage.

2. The display device of claim 1, wherein the gate turn-on voltage is determined so that at least one of the pixels has a substantial maximum luminance at the maximum value of the data voltage.

3. The display device of claim 2, wherein the maximum value of the data voltage is in a range of about 10 V to about 15 V.

4. The display device of claim 2, wherein each of the pixels further comprises a driving transistor and a light emitting element, the driving transistor being connected to the switching transistor, the light emitting element being connected to the driving transistor.

5. The display device of claim 4, wherein each of the pixels further comprises a storage capacitor connected to the switching transistor.

6. The display device of claim 5, wherein the switching transistor and/or the driving transistor comprises amorphous silicon or polycrystalline silicon.

7. The display device of claim 5, further comprising:

a driving voltage generator that generates the gate turn-on voltage and the gate turn-off voltage;

a scan driver that transmits the gate turn-on voltage to the scanning lines; and a data driver that transmits the data voltage to the data lines.

8. A display device comprising:

a plurality of pixels, each of the pixels comprising a switching transistor and a driving transistor connected to the switching transistor and a power supply voltage;

a plurality of scanning lines connected to the switching transistors of the pixels, wherein the scanning lines transmit a gate turn-on voltage that turns on the switching transistors and a gate turn-off voltage that turns off the switching transistors; and a plurality of data lines connected to the switching transistors, the data lines to transmit a data voltage, wherein the gate turn-on voltage is determined based on a maximum value of the data voltage, wherein the gate turn-on voltage follows the following formula:

$$Vdm-3 \leqq Von \leqq Vdm+6$$

wherein Von is the gate turn-on voltage and Vdm is the maximum value of the data voltage.

9. A device for driving a display device, the display device comprising a plurality of pixels, each of the pixels comprising a switching transistor and a driving transistor connected to the switching transistor and a power supply voltage, a plurality of scanning lines connected to the switching transistors of the pixels, and a plurality of data lines connected to the switching transistors, the scanning lines to transmit a gate turn-on voltage that turns on the switching transistors and a gate turn-off voltage that turns off the switching transistors, the data lines to transmit a data voltage, comprising:

a driving voltage generator that generates the gate turn-on voltage and the gate turn-off voltage;

a scan driver that transmits the gate turn-on voltage to the scanning lines; and a data driver that transmits the data voltage to the data lines, wherein the gate turn-on voltage follows the following formula:

$$Vdm-3 \leqq Von \leqq Vdm+6$$

wherein Von is the gate turn-on voltage and Vdm is the maximum value of the data voltage.

10. The device of claim 9, wherein the gate turn-on voltage is determined so that at least one of the pixels has a substantial maximum luminance at the maximum value of the data voltage.

11. The device of claim 10, wherein the maximum value of the data voltage is in a range of about 10 V to about 15 V.

* * * * *